(12) United States Patent
Eppich

(10) Patent No.: US 8,867,586 B2
(45) Date of Patent: Oct. 21, 2014

(54) DIODE LASER

(75) Inventor: Bernd Eppich, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 13/431,530

(22) Filed: Mar. 27, 2012

(65) Prior Publication Data

US 2012/0250712 A1 Oct. 4, 2012

(30) Foreign Application Priority Data

Mar. 28, 2011 (DE) .......................... 10 2011 006 198

(51) Int. Cl.
H01S 3/08 (2006.01)
H01S 5/14 (2006.01)
H01S 5/00 (2006.01)

(52) U.S. Cl.
CPC ........ *H01S 5/141* (2013.01); *H01S 5/005* (2013.01)
USPC ............... 372/102; 372/101; 372/92; 372/32; 372/29.02

(58) Field of Classification Search
USPC ............................ 372/102, 101, 92, 32, 29.02
See application file for complete search history.

(56) References Cited

U.S. PATENT DOCUMENTS

| 6,650,665 | B2 * | 11/2003 | Hwu et al. ........................ 372/19 |
| 7,298,711 | B1 | 11/2007 | Volodin et al. |
| 7,397,837 | B2 | 7/2008 | Volodin et al. |
| 7,545,844 | B2 | 6/2009 | Volodin et al. |
| 2002/0154673 | A1 * | 10/2002 | Hwu et al. ........................ 372/92 |
| 2005/0207466 | A1 | 9/2005 | Glebov et al. |
| 2006/0029120 | A1 | 2/2006 | Mooradian et al. |
| 2006/0251143 | A1 * | 11/2006 | Volodin et al. ................ 372/102 |
| 2008/0267246 | A1 | 10/2008 | Volodin et al. |
| 2010/0073747 | A1 * | 3/2010 | Su et al. .......................... 359/24 |

FOREIGN PATENT DOCUMENTS

DE     10 2008 044 867 A1   3/2010

OTHER PUBLICATIONS

Schnitzler et al., "Wavelength Stabilization of HPDL Array—Fast-Axis Collimation Optic with Integrated VHG," Proc. of SPIE, vol. 6456 645612, p. 1-6, (2007).

* cited by examiner

*Primary Examiner* — Kinam Park
(74) *Attorney, Agent, or Firm* — Norris McLaughlin & Marcus PA

(57) ABSTRACT

A diode laser is provided with wavelength stabilization and vertical collimation of the emitted radiation, which allows a small distance of the volume Bragg grating from the emitting surface, a small vertical diameter of the collimated beam and also compensation for manufacturing tolerances affecting the shape of the grating and the lens. The diode laser comprises an external frequency-selective element for wavelength stabilization of the laser radiation, wherein the external frequency-selective element comprises an entry surface facing the exit facet and an exit surface facing away from the exit facet and is designed as a volume Bragg grating; and wherein the external frequency-selective element is designed in such a manner that the divergence of the radiation emitting from the exit facet is reduced during passage through the external frequency-selective element.

10 Claims, 1 Drawing Sheet

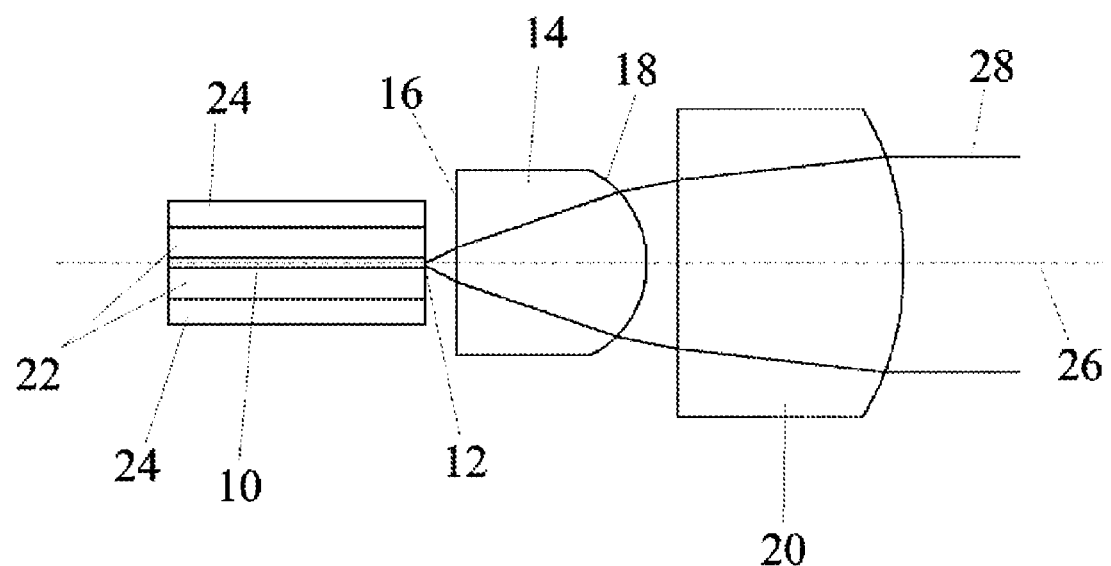

DIODE LASER

BACKGROUND OF THE INVENTION

The present invention relates to a diode laser with spectrally selective feedback by means of a volume Bragg grating; in particular, the present invention relates to a low-noise, wavelength-stabilized diode laser with collimated radiation and a small beam diameter.

The radiation of edge-emitting diode lasers is highly divergent in a direction perpendicular to the waveguide plane (vertical direction, "fast axis") and has a comparatively broad wavelength spectrum. In addition, the wavelength spectrum typically depends on further parameters, such as the temperature. As a result, the wavelength spectrum depends on the power supplied by the laser To collimate the radiation in the vertical direction, cylindrical lenses with short focal lengths, so-called fast-axis collimators (FAC), are mostly used. In this case, the beam diameter of the collimated beam is proportional to the divergence of the radiation emitting from the diode laser and to the focal length of the vertically collimating lens. According to the state of the art, the wavelengths can be limited and stabilized by means of internal or external wavelength-selective elements or structures.

An external limitation and stabilization of the wavelengths is achieved as a result of spectrally selective feedback of the emitted radiation into the diode laser. An example are so-called external-cavity diode lasers (ECL) where feedback is done by means of spectrally selective reflection on surface gratings. This, however, has the drawback that additional optical elements are required and miniaturization is made difficult.

Another way to achieve spectrally selective feedback is the use of volume Bragg gratings. The advantage of using such volume Bragg gratings is that compact, wavelength-stabilized laser beam sources can be implemented.

For example, US 2005/0207466 A1, US 2006/0251143 A1, U.S. Pat. No. 7,298,771 B2, U.S. Pat. No. 7,397,837 B2 and U.S. Pat. No. 7,545,844 B2 teach how to place a planar volume Bragg grating in the vertically collimated or vertically and laterally collimated beam.

As an alternative, a planar volume Bragg grating can be placed in the divergent beam in front of the fast-axis collimator and vertical and lateral collimation is not done until the radiation has been transmitted through the volume Bragg grating, as is also known from US 2005/0207466 A1, US 2006/0251143 A1, U.S. Pat. No. 7,298,771 B2, U.S. Pat. No. 7,397,837 B2 and U.S. Pat. No. 7,545,844 B2.

In addition, it is known to manufacture the vertically collimating cylindrical lens (i.e. the fast-axis collimator) itself integrally with the volume Bragg grating, thus producing a single optical element which does both vertical collimation of the transmitted radiation and spectrally selective feedback.

If the volume Bragg grating is positioned behind the vertically collimating lens, there is the drawback that the desired small distance of the grating from the emitting surface (hereinafter also referred to as exit facet of the diode laser) is not possible, due to the necessary axial extension of the vertically collimating lens. It has been found, however, that placement of the volume Bragg grating close to the emitting surface is an essential requirement for low-noise operation of the diode laser.

If the volume Bragg grating is positioned between the emitting surface and the vertically collimating lens, the distance between the emitting surface and the grating can be made small, thus ensuring low-noise operation. In this case, however, the vertical beam diameter of the collimated beam has a lower limit, due to the axial dimensions of the volume Bragg grating and the vertically collimating lens. There are minimum required axial dimensions of the grating due to functional reasons and of the lens due to manufacturing reasons, and this entails the drawback of a non-negligible minimum size of the vertical diameter of the collimated beam.

If the volume Bragg grating itself is designed as a single vertically collimating lens, the desired small distance of the grating from the emitting surface must correspond to the back focal length of the grating/lens unit. For proper collimation, the grating/lens unit must be positioned within the back focal length from the emitting surface. Due to manufacturing tolerances, however, the back focal length varies to a degree that can be much greater than the desired distance of the grating from the emitting surface. In particular, the back focal length can become negative, so that collimation is no longer possible.

In summary, none of the methods and devices mentioned above enables the volume Bragg grating to be placed as close as possible to the emitting surface to ensure low-noise operation on the one hand while also placing the vertically collimating lens as close as possible to the emitting surface to ensure a sufficiently small vertical diameter on the other. In particular, one of the components cannot be placed close enough to the emitting surface if two components are used (planar volume Bragg grating and cylindrical lens). If a single optical element incorporating the cylindrical lens and the volume Bragg grating is used, the existing manufacturing tolerances, combined with the requirement of a very small vertical beam diameter, may result in a negative back focal length, so that collimation is no longer possible.

Therefore, the object of the invention is to provide a diode laser with wavelength stabilization and vertical collimation of the emitted radiation, which allows a small distance of the volume Bragg grating from the emitting surface, a small vertical diameter of the collimated beam and also compensation for manufacturing tolerances affecting the shape of the grating and the lens.

SUMMARY OF THE INVENTION

It has been found that a small vertical beam diameter of the collimated beam and a small distance of the volume Bragg grating from the emitting surface can be achieved if vertical collimation is done partly by means of a volume Bragg grating and partly by a vertically collimating lens, wherein manufacturing tolerances affecting the shape of the volume Bragg grating and the vertically collimating lens can advantageously be compensated for by adjusting the axial position of the vertically collimating lens.

In other words, a volume Bragg grating with a focus effect and a vertically collimating lens are used instead of a planar volume Bragg grating and a vertically collimating lens. This means that the volume Bragg grating as well as the vertically collimating lens arranged behind have a vertical focus effect. As a result, the refractive power can advantageously be divided between several elements.

Compared to the use of a planar volume Bragg grating and a cylindrical lens, the advantage is that both the volume Bragg grating and the first vertically collimating lens (the volume Bragg grating) can be placed very close to the emitting surface, thus ensuring low-noise operation as well as a sufficiently small vertical diameter. As vertical collimation is also done by the volume Bragg grating itself, a smaller vertical beam diameter can be achieved.

Compared to the use of a single optical element incorporating the cylindrical lens and the volume Bragg grating, the advantage is that the required refractive power can be divided between two optical elements, thus achieving higher beam quality (improved suppression of aberrations owing to the use of two optical elements) on the one hand and allowing greater component tolerances on the other.

The diode laser according to the invention comprises an active layer including an exit facet; an external frequency-selective element for wavelength stabilization of the emitted radiation, wherein the external frequency-selective element comprises an entry surface facing the exit facet and an exit surface facing away from the exit facet and is designed as a volume Bragg grating; wherein the diode laser according to the invention further comprises a separate collimator unit for collimating the laser radiation emitting from the exit facet and passing through the external frequency-selective element in a divergent form; wherein the external frequency-selective element is arranged between the collimator unit and the exit facet, and wherein the entry surface and/or the exit surface of the external frequency-selective element is/are designed in such a manner that the divergence of the laser radiation emitting from the exit facet is reduced during passage through the external frequency-selective element.

The entry surface and/or the exit surface of the external frequency-selective element are preferably designed as a non-planar surface. Said entry surface and/or exit surface can preferably be designed as cylindrical or non-cylindrical surfaces. The refractive power is now divided between the external frequency-selective element and the separate, vertically collimating lens arranged behind the external frequency-selective element; as a result, the radii of curvature of the two optical elements (external frequency-selective element=1st lens; separate, vertically collimating lens=2nd lens) can be greater. Another advantage is that manufacturing tolerances affecting the shape of the volume Bragg grating (external frequency-selective element) and of the vertically collimating lens (collimator unit) can advantageously be compensated for by adjusting the axial position of the vertically collimating lens. There is preferably no other optical element between the volume Bragg grating (external frequency-selective element) and the vertically collimating lens (collimator unit). There is preferably air between the volume Bragg grating (external frequency-selective element) and the vertically collimating lens (collimator unit).

The ratio of the refractive power of the external frequency-selective element to the refractive power of the collimator unit is preferably between 0.1 and 10, more preferred between 0.5 and 2, even more preferred between 0.7 and 1.5, even more preferred between 0.85 and 1.2, and is more preferably 1.

The collimator unit is preferably designed as a cylindrical lens. At least one surface of the collimator unit and the frequency-selective element is preferably designed as a non-planar non-cylindrical surface to reduce aberrations. The distance between the exit facet of the diode laser and the entry surface of the external frequency-selective element is preferably between 10 μm and 500 μm, more preferred between 15 μm and 100 μm, and even more preferred between 20 μm and 50 μm. The diode laser according to the invention is preferably designed as an edge emitter.

BRIEF DESCRIPTION OF THE DRAWINGS

The invention will now be explained in more detail with reference to a preferred embodiment shown in more detail in the FIGURE.

FIG. 1 shows a schematic, sectional view of a diode laser according to the invention.

DETAILED DESCRIPTION OF THE INVENTION

The diode laser according to the invention shown in FIG. 1 comprises an active layer 10 including an exit facet 12 and an external frequency-selective element 14 for wavelength stabilization of the laser radiation, wherein the external frequency-selective element 14 is designed as a volume Bragg grating and comprises an entry surface 16 facing the exit facet 12 of the diode laser and an exit surface 18 facing away from the exit facet 12 of the diode laser. In addition, the diode laser comprises a collimator unit 20 for collimating the laser radiation emitting from the exit facet 12 and passing through the external frequency-selective element 14 in a divergent form, wherein the external frequency-selective element 14 is arranged between the collimator unit 20 and the exit facet 12. According to the invention, the external frequency-selective element 14 is designed in such a manner that the divergence of the radiation emitting from the exit facet 12 is reduced during passage through the external frequency-selective element 14.

A small vertical beam diameter of the collimated beam and a small distance of the volume Bragg grating from the emitting surface can be achieved if vertical collimation is done partly by means of a volume Bragg grating and partly by a vertically collimating lens, wherein manufacturing tolerances affecting the shape of the volume Bragg grating and the vertically collimating lens can advantageously be compensated for by adjusting the axial position of the vertically collimating lens.

According to the invention, a volume Bragg grating with a focus effect and a vertically collimating lens are therefore used instead of a planar volume Bragg grating and a vertically collimating lens. This means that the volume Bragg grating as well as the vertically collimating lens arranged behind have a vertical focus effect. As a result, the refractive power can advantageously be divided between several elements.

LIST OF REFERENCE NUMERALS

10 Active layer
12 Exit facet of the diode laser
14 Frequency-selective element
16 Entry surface of the frequency-selective element
18 Exit surface of the frequency-selective element
20 Collimator unit/cylindrical lens
22 Waveguide layer
24 Cladding layer
26 Optical axis
28 Marginal ray

The invention claimed is:
1. A diode laser, comprising:
an active layer including an exit facet;
an external frequency-selective element for wavelength stabilization of a laser radiation, wherein the external frequency-selective element comprises an entry surface facing the exit facet and an exit surface facing away from the exit facet and is designed as a volume Bragg grating; and
a collimator unit for collimating the laser radiation emitting from the exit facet and passing through the external frequency-selective element in a divergent form;
wherein the external frequency-selective element is arranged between the collimator unit and the exit facet,
wherein the external frequency-selective element is designed in such a manner that the divergence of the radiation emitting from the exit facet is reduced during passage through the external frequency-selective element, wherein a ratio of the refractive power of the external frequency-selective element to the refractive power of the collimator unit is between 0.1 and 10.

2. The diode laser according to claim 1,
wherein the entry surface and/or the exit surface of the external frequency-selective element are designed as a non-planar surface.

3. The diode laser according to claim 1,
wherein the entry surface and/or the exit surface of the external frequency-selective element are designed as a continuous, curved surface.

4. The diode laser according to claim 1,
wherein the ratio of a refractive power of the external frequency-selective element to a refractive power of the collimator unit is between 0.5 and 2.

5. The diode laser according to claim 1, wherein the collimator unit is designed as a cylindrical lens.

6. The diode laser according to claim 5,
wherein at least one surface of the collimator unit and the frequency-selective element is designed as a non-planar non-cylindrical surface to reduce aberrations.

7. The diode laser according to claim 1,
wherein the distance between the exit facet of the diode laser and the entry surface of the external frequency-selective element is between 15 μm and 100 μm.

8. The diode laser according to claim 1, wherein the diode laser is designed as an edge emitter.

9. A diode laser, comprising:
an active layer including an exit facet;
an external frequency-selective element for wavelength stabilization of a laser radiation, wherein the external frequency-selective element comprises an entry surface facing the exit facet and an exit surface facing away from the exit facet and is designed as a volume Bragg grating; and
a collimator unit for collimating the laser radiation emitting from the exit facet and passing through the external frequency-selective element in a divergent form;
wherein the external frequency-selective element is arranged between the collimator unit and the exit facet,
wherein the external frequency-selective element is designed in such a manner that the divergence of the radiation emitting from the exit facet is reduced during passage through the external frequency-selective element,
wherein the active layer, the external frequency-selective element and the collimator unit are arranged along a common optical axis.

10. A diode laser, comprising:
an active layer including an exit facet;
an external frequency-selective element for wavelength stabilization of a laser radiation, wherein the external frequency-selective element comprises an entry surface facing the exit facet and an exit surface facing away from the exit facet and is designed as a volume Bragg grating; and
a collimator unit for collimating the laser radiation emitting from the exit facet and passing through the external frequency-selective element in a divergent form;
wherein the external frequency-selective element is arranged between the collimator unit and the exit facet,
wherein the external frequency-selective element is designed in such a manner that the divergence of the radiation emitting from the exit facet is reduced during passage through the external frequency-selective element,
wherein a ratio of the refractive power of the external frequency-selective element to the refractive power of the collimator unit is between 0.5 and 2, and
wherein the distance between the exit facet of the diode laser and the entry surface of the external frequency-selective element is between 15 μm and 100 μm.

\* \* \* \* \*